(12) United States Patent
Chen et al.

(10) Patent No.: US 12,205,998 B2
(45) Date of Patent: Jan. 21, 2025

(54) SEMICONDUCTOR DEVICE WITH WRAP AROUND SILICIDE AND HYBRID FIN

(71) Applicant: Taiwan Semiconductor Manufacturing Co., Ltd., Hsinchu (TW)

(72) Inventors: Shih-Cheng Chen, Hsinchu (TW); Zhi-Chang Lin, Hsinchu (TW); Jung-Hung Chang, Hsinchu (TW); Chien-Ning Yao, Hsinchu (TW); Tsung-Han Chuang, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 560 days.

(21) Appl. No.: 17/576,748

(22) Filed: Jan. 14, 2022

(65) Prior Publication Data

US 2022/0416036 A1    Dec. 29, 2022

Related U.S. Application Data

(60) Provisional application No. 63/214,665, filed on Jun. 24, 2021.

(51) Int. Cl.
*H01L 29/417* (2006.01)
*H01L 21/762* (2006.01)
*H01L 27/088* (2006.01)
*H01L 29/66* (2006.01)

(52) U.S. Cl.
CPC .. *H01L 29/41733* (2013.01); *H01L 21/76224* (2013.01); *H01L 27/088* (2013.01); *H01L 29/66742* (2013.01)

(58) Field of Classification Search
CPC ......... H01L 29/41733; H01L 21/76224; H01L 27/088; H01L 29/66742; H01L 21/823418; H01L 29/0673; H01L 29/41725; H01L 29/42392; H01L 29/66439; H01L 29/66545; H01L 29/775; H01L 29/78696; H01L 21/823475; H01L 21/823481
See application file for complete search history.

(56) References Cited

U.S. PATENT DOCUMENTS 9,236,267 B2   1/2016  De et al.
9,502,265 B1   11/2016 Jiang et al.
9,520,466 B2   12/2016 Holland et al.
(Continued)

*Primary Examiner* — Victor A Mandala
(74) *Attorney, Agent, or Firm* — Seed IP Law Group

(57) ABSTRACT

A device includes a substrate. A first channel region of a first transistor overlies the substrate and a source/drain region is in contact with the first channel region. The source/drain region is adjacent to the first channel region along a first direction, and the source/drain region has a first surface opposite the substrate and side surfaces extending from the first surface. A dielectric fin structure is adjacent to the source/drain region along a second direction that is transverse to the first direction, and the dielectric fin structure has an upper surface, a lower surface, and an intermediate surface that is disposed between the upper and lower surfaces. A silicide layer is disposed on the first surface and the side surfaces of the source/drain region and on the intermediate surface of the dielectric fin structure.

20 Claims, 13 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 11,855,079 B2 * | 12/2023 | Chiang ................. H01L 29/775 |
| 12,087,834 B2 * | 9/2024 | Huang .............. H01L 21/31116 |
| 12,087,837 B2 * | 9/2024 | Chen ................... H01L 29/0665 |
| 2022/0359652 A1 * | 11/2022 | Lin ................. H01L 21/823418 |
| 2022/0367462 A1 * | 11/2022 | Chiang ........... H01L 21/823842 |
| 2023/0012216 A1 * | 1/2023 | Lin ..................... H01L 29/0673 |
| 2023/0028900 A1 * | 1/2023 | Lin ..................... H01L 29/0649 |
| 2023/0137307 A1 * | 5/2023 | Chen ................. H01L 29/66545 |
| | | 257/401 |
| 2023/0207670 A1 * | 6/2023 | Lin ..................... H01L 29/7851 |
| | | 257/401 |
| 2023/0253256 A1 * | 8/2023 | Huang ............... H01L 27/0886 |
| | | 257/288 |
| 2023/0307456 A1 * | 9/2023 | Lin ................. H01L 21/823807 |
| 2023/0369401 A1 * | 11/2023 | Huang ............... H01L 29/0673 |
| 2024/0251537 A1 * | 7/2024 | Yu ................... H01L 21/823864 |

* cited by examiner

SEMICONDUCTOR DEVICE WITH WRAP AROUND SILICIDE AND HYBRID FIN

BACKGROUND

There has been a continuous demand for increasing computing power in electronic devices including smart phones, tablets, desktop computers, laptop computers and many other kinds of electronic devices. Semiconductor devices provide the computing power for these electronic devices. One way to increase computing power in semiconductor devices is to increase the number of transistors and other semiconductor device features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Source and drain regions may be coupled to the nanostructures. It can be difficult to form source and drain regions with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
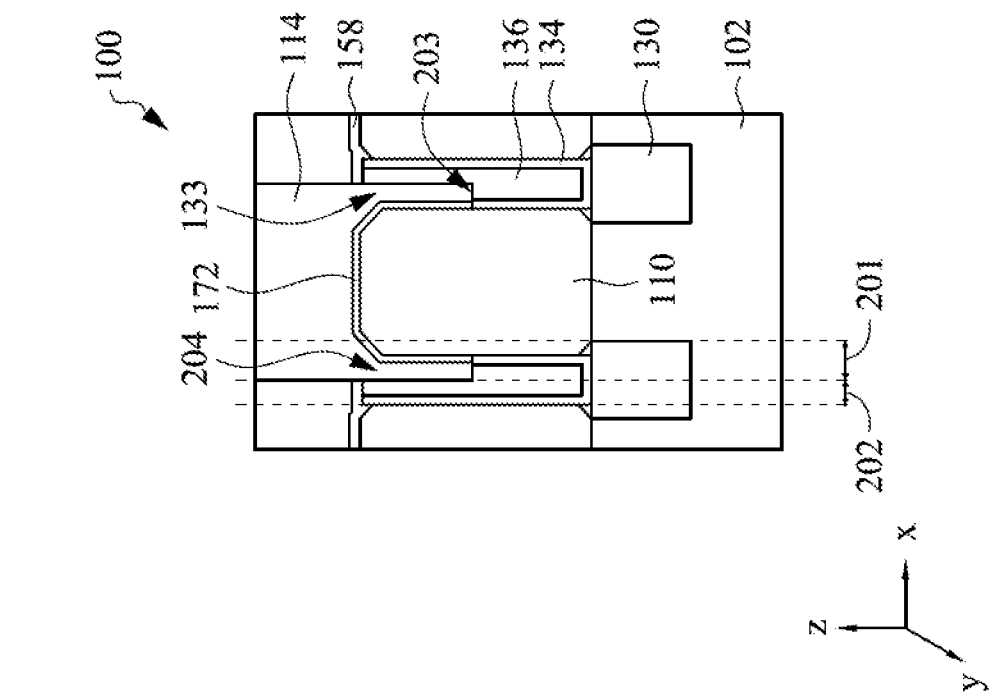
FIGS. 1A and 1B are cross-sectional views of an semiconductor device, in accordance with some embodiments.

In the following description, many thicknesses and materials are described for various layers and structures within a semiconductor device. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a semiconductor device having improved performance due at least in part to a reduced electrical resistance through source/drain regions. In some embodiments, the semiconductor device includes one or more nanostructure transistors having a plurality of semiconductor nanostructures arranged in a stack overlying a substrate. The nanostructures act as channel regions of the nanostructure transistor. Each nanostructure transistor includes source/drain regions in contact with the nanostructures. A silicide is formed on the source/drain regions and may wrap around or contact at least three surfaces (e.g., an upper and opposite side surfaces) of the source/drain regions. Source/drain contacts are disposed in contact with the silicide. The silicide extends along the side surfaces of the source/drain regions and on an intermediate surface of one or more hybrid fin structures. A portion of the source/drain contact extends downward along side surfaces of the silicide and contacts the intermediate surface of the hybrid fin structures. As such, there is a relatively small distance between each nanostructure and the silicide.

Due to the presence of the wrap around silicide, the electrical resistance between the lowest nanostructures and the silicide is greatly reduced with respect to configurations in which the silicide is formed only at the top of the source/drain regions, resulting in reduced power consumption. Moreover, a large number of nanostructures can be formed without negatively impacting the electrical resistance between lower nanostructures and the silicide. With larger numbers of nanostructures, currents can be conducted through nanostructure transistors without generating excessive amounts of heat. Accordingly, a semiconductor device in accordance with principles of the present disclosure consumes less power and generates less heat. The reduction in heat can also prevent damage to the semiconductor device from overheating. Thus, principles of the present disclosure provide substantial benefits to transistor function and overall semiconductor device function.

Figure 1A:
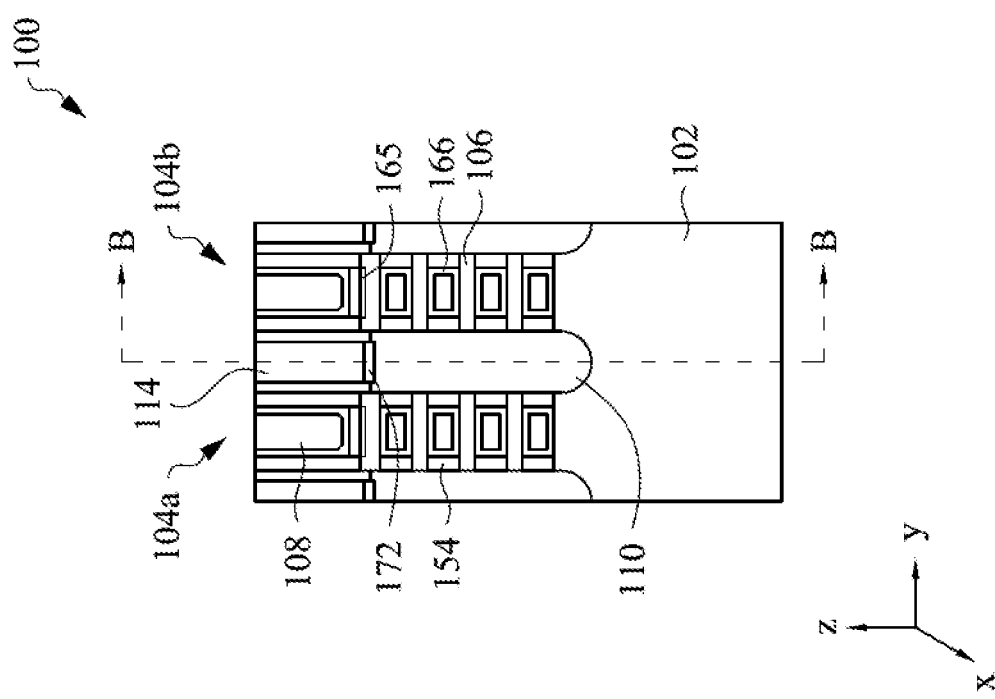

FIG. 1A is a cross-sectional view illustrating a semiconductor device 100 and FIG. 1B is a cross-sectional view of the semiconductor device 100 taken along the cut line B of FIG. 1A, in accordance with some embodiments. The semiconductor device 100 includes a semiconductor substrate 102. The semiconductor device also includes first and second transistors 104a, 104b on the semiconductor substrate 102. As set forth in more detail below, the semiconductor device 100 utilizes a silicide layer that wraps around the source/drain regions to improve the performance of the transistors 104a, 104b.

Each of the transistors 104a, 104b includes a respective stack of semiconductor nanostructures 106, a gate electrode 108, and source/drain regions 110. A silicide 172 is in contact with the source/drain regions 110. Source/drain contacts 114 are in contact with the silicide 172. The semiconductor nanostructures 106 act as channel regions of the transistors 104a, 104b. The transistors 104a, 104b can be operated by applying voltages to the gate electrodes 108 and the source/drain contacts 114 in order to enable or prevent current flowing through the semiconductor nanostructures 106 between the source/drain regions 110.

The semiconductor nanostructures 106 each extend between the neighboring source/drain regions 110. The semiconductor nanostructures 106 can include a monocrystalline semiconductor material such as silicon, silicon germanium, or other semiconductor materials. The semiconductor nanostructures 106 may be an intrinsic semiconductor material or may be a doped semiconductor material. The semiconductor nanostructures may include nanosheets, nanowires, or other types of nanostructures.

The gate electrode 108 includes one or more conductive materials. The gate electrode 108 can include one or more of tungsten, aluminum, titanium, tantalum, copper, gold, or other conductive materials. In some embodiments, the gate electrode 108 surrounds (e.g., surrounds at least four sides) the nanostructures 106 such that each semiconductor nanostructure 106 extends through the gate electrode 108 between the source/drain regions 110. A gate dielectric surrounds the nanostructures 106 and acts as a dielectric sheath between the nanostructures 106 and the gate electrode 108. Accordingly, the transistor 104 may be considered a gate all around nanostructure transistor. While examples illustrated herein primarily utilized gate all around transistors, other types of transistors can be utilized without departing from the scope of the present disclosure.

As shown in FIG. 1A, the gate dielectric may include an interfacial dielectric layer 165 and a high-K gate dielectric layer 166 positioned on the interfacial dielectric layer 165.

Each of the transistors 104a, 104b includes source/drain regions 110 in contact with opposite sides of the semiconductor nanostructures 106. The source/drain can include semiconductor material such as silicon or silicon germanium doped with N-type dopants species or P-type dopant species depending on the type of the transistors 104a, 104b.

As shown in FIG. 1A, the transistors 104a, 104b include inner spacers 154 at lateral sides of each of the semiconductor nanostructures 106. The inner spacers 154 are dielectric regions that physically and electrically separate the gate electrode 108 from the source/drain regions 110. The inner spacers 154 can include silicon nitride, SiCN, SiOCN, or other suitable dielectric materials.

As shown in FIG. 1B, a hybrid fin structure 133 is disposed between adjacent source/drain regions 110 along the Y-axis direction. As such, the source/drain regions 110 are adjacent to the semiconductor nanostructures 106 along a first direction (e.g., the X-axis direction), and the hybrid fin structure 133 is disposed adjacent to the source/drain regions 110 along a second direction (e.g., the Y-axis direction) that is transverse to the first direction. The hybrid fin structures 133 include a first dielectric layer 134 and a second dielectric layer 136. In some embodiments, the first dielectric layer 134 is formed of a dielectric material, which may be a low-K dielectric material. In some embodiments, the first dielectric layer 134 may include silicon nitride. In some embodiments, the first dielectric layer 134 is formed of a dielectric material, which may include silicon oxide. The first dielectric layer 134 may be formed on and in contact with the shallow trench isolation regions 130.

As shown in FIG. 1B, the hybrid fin structures 133 may have a "L" shape or backward "L" shape which is formed by a recess in the first and second dielectric layers 134, 136. For example, as shown, each of the first and second dielectric layers 134, 136 may have a top surface (which may be covered by a dielectric layer 158) and an intermediate surface 203 that is substantially parallel to the top surface and which is covered by and contacted by the source/drain contacts 114. In some embodiments, the intermediate surface 203 may be at a level that is substantially equal to or less than half of the height of the source/drain regions 110. The source/drain contacts 114 extend into the recessed region or portion of the hybrid structures 113 and cover the intermediate surface 203 of the hybrid fin structures 113.

The silicide 172 acts as an interface between the semiconductor material of the source/drain region 110, and the metal or conductive material of the source/drain contacts 114. The silicide 172 is formed on top of the source/drain regions 110 and on side surfaces of the source/drain regions 110, between the side surfaces of the source/drain regions 110 and the source/drain contacts 114. In some embodiments, the silicide 172 may be a "wrap around" silicide that covers and contacts at least the top surface and two side surfaces of each of the source/drain regions 110. This increases a contact area between the silicide 172 and the source/drain regions 110.

The silicide 172 may include any suitable silicide. In some embodiments, the silicide 172 includes one or more of titanium silicide, cobalt silicide, ruthenium silicide, aluminum silicide, nickel silicide, or other silicides.

The contact between the wrap around silicide 172 and the source/drain regions 110 reduces a contact resistance along a current path through the source/drain regions 110 to the semiconductor nanostructures 106, as the relatively high resistance source/drain material is substantially surrounded (e.g., along at least three sides in some embodiments) by the highly conductive silicide 172.

In some embodiments, the silicide 172 has a thickness (e.g., along the X-axis direction) between 1 nm and 10 nm. In some embodiments, the silicide 172 has a thickness (e.g., along the X-axis direction) between 3 nm and 10 nm. The silicide 172 can have other dimensions and shapes without departing from the scope of the present disclosure.

In some embodiments, the silicide 172 may include both the semiconductor material of the source/drain region 110 and a metal. In some embodiments, the silicide 172 includes one or more of titanium silicide, cobalt silicide, ruthenium silicide, aluminum silicide, nickel silicide, or other silicides. The silicide 172 is highly conductive compared to the source/drain regions 106.

The source/drain contacts 114 may be metal plugs or conductive vias through which voltages are applied to the source/drain regions 110. The source/drain contacts 114 can include tungsten, aluminum, titanium, copper, or other suitable conductive materials. The source/drain contacts 114 are positioned above the source/drain regions 110. The source/drain contacts 114 are in direct contact with the silicide 172, for example, at an upper surface of the silicide 172. Accordingly, the source/drain contacts 114 apply voltages to the source/drain regions 110 via the silicide 172. Similarly, currents flow between the source/drain contacts 114 and the source/drain regions 110 via the silicide 172.

The semiconductor nanostructures 106 are arranged in a vertical stack above the substrate 102. A vertically lowest nanostructure 106 corresponds to the semiconductor nanostructure 106 closest to the substrate 102. A vertically highest nanostructure 106 is closest to the source/drain contacts 114.

As shown in FIG. 1B, in some embodiments a lateral distance 201 between a recessed side surface 204 of the second dielectric layer 136 of the hybrid fin structures 133 and a lateral side surface of the corresponding underlying shallow trench isolation region 130 may be less than 100 nm. In some embodiments, the lateral distance 201 may be less than 50 nm. In some embodiments, the lateral distance 201 may be greater than 10 nm. In some embodiments, the lateral distance 201 is within a range from about 10 nm to 100 nm, which may advantageously provide good electrical contact between the source/drain contacts 114 and side surfaces of the silicide 172 which cover corresponding side surfaces of the source/drain regions 110.

As shown in FIG. 1B, in some embodiments a lateral distance 202 between an outer surface of the second first dielectric layer 134 and a recessed lateral side surface 204 of the second dielectric layer 136 of the hybrid fin structures 133 may be less than 100 nm. In some embodiments, the lateral distance 202 may be less than 50 nm. In some embodiments, the lateral distance 202 may be less than 10 nm. In some embodiments, the lateral distance 202 is within a range from about 5 nm to 10 nm, which may advantageously provide sufficient width of the hybrid fin structures 133 in a recessed region of the hybrid fin structures in which the source/drain contacts 114 extend and contact side surfaces of the silicide 172.

Figure 2B:
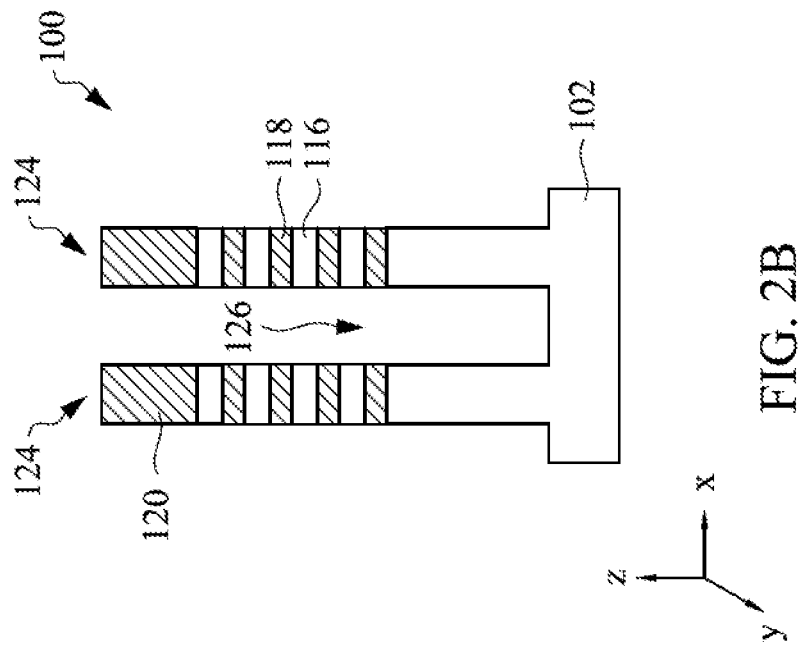
FIGS. 2A-2X are cross-sectional views of a semiconductor device, at various stages of processing, in accordance with some embodiments.

Moreover, as shown in FIG. 1B, since the silicide 172 extends into a recessed region at which the hybrid fin structures 133 are laterally recessed, a lateral width of the transistors (e.g., along the X-axis direction) may be reduced. That is, additional space is not provided for the silicide 172, since the silicide 172 may be disposed within the recessed portion of the hybrid fin structures 133. Indeed, as shown in FIGS. 1B and 2X, a portion of the sides of the source/drain regions 110 contact lower side surface portions of the first dielectric layer 134 of the hybrid fin structures 133. As such, the hybrid fin structures 133 are not entirely spaced laterally apart from the source/drain regions 110 in order to accommodate the silicide 172, but instead, the silicide 172 may be disposed in the recessed portion of the hybrid fin structures 133.

Current that flows through the bottom semiconductor nanostructure 106 has a longer path than current that flows to the top semiconductor nanostructure 106. In a situation in which the silicide 172 does not extend downward along the lateral side surfaces of the source/drain regions 110, then current that flows through the bottom semiconductor nanostructure 106 will take a relatively long path through the source/drain regions 110. The source/drain regions 110 are not as conductive as the silicide 172. Accordingly, a longer path through the source/drain regions 106 corresponds to a larger electrical resistance, greater power dissipation, and greater heat generation. However, the transistors 104a, 104b of FIGS. 1A and 1B include silicide 172 that extends downward along the lateral side surfaces of the source/drain regions 110. The result is that there is a relatively small distance between the lowest semiconductor nanostructures 106 and the silicide 172. Because the silicide 172 is highly conductive compared to the source/drain regions 110, current that flows through the lowest nanostructures 106 will primarily flow through the path of least resistance downward through the silicide 172 and then laterally through the source/drain regions 110 to the lowest nanostructures 106. This reduces the overall resistance, power dissipation, and heat generation in comparison to a situation in which the silicide 172 is positioned only and the top surfaces of the source/drain regions 110.

FIGS. 1A and 1B illustrate four semiconductor nanostructures 106 in each of the transistors 104a, 104b. However, the configuration of the silicide 172 enables the use of more semiconductor nanostructures 106 without undue electrical resistance and corresponding power dissipation and heat generation. Accordingly, the transistors 104a, 104b can include larger numbers of semiconductor nanostructures 106 than shown in FIGS. 1A and 1B. However, the transistors 104a, 104b can include fewer or more semiconductor nanostructures 106 than shown without departing from the scope of the present disclosure.

FIGS. 2A-3D are cross-sectional views of an semiconductor device 100 at various stages of processing, according to some embodiments. FIGS. 2A-3D illustrate an exemplary process for producing an semiconductor device that includes nanostructure transistors. FIGS. 2A-3D illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

Figure 2A:
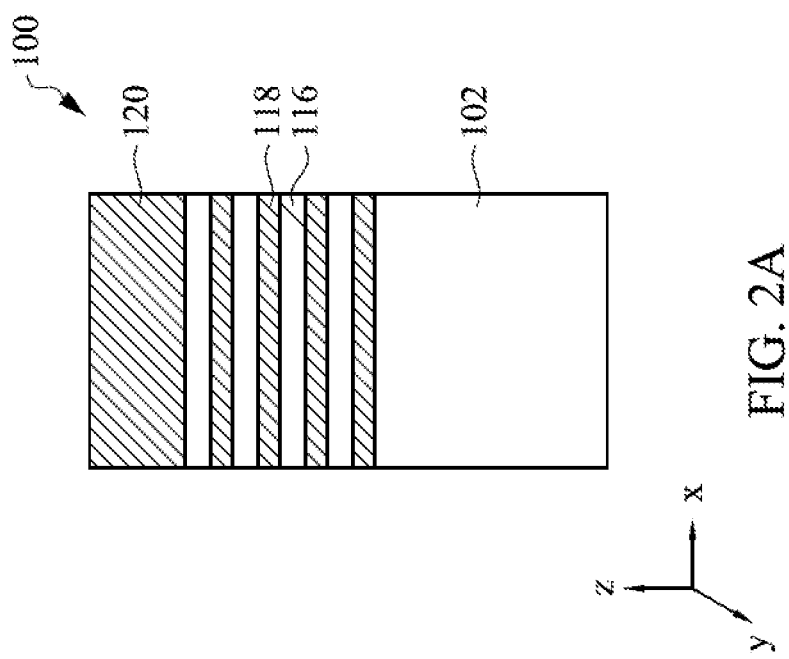
Figure 2D:
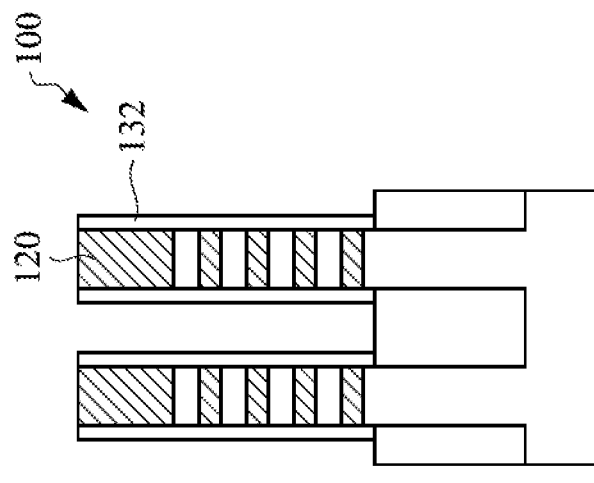
Figure 2C:
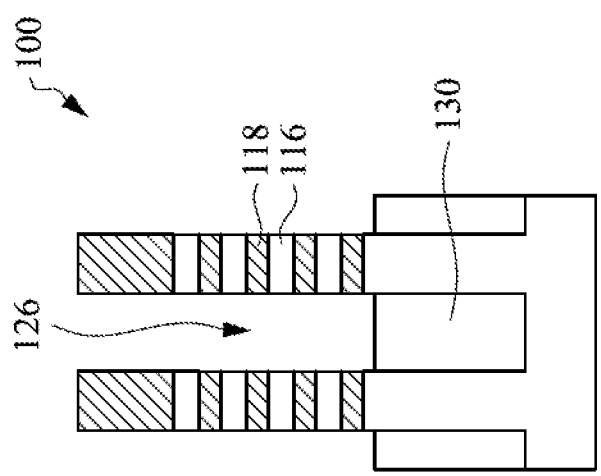
Figure 2F:
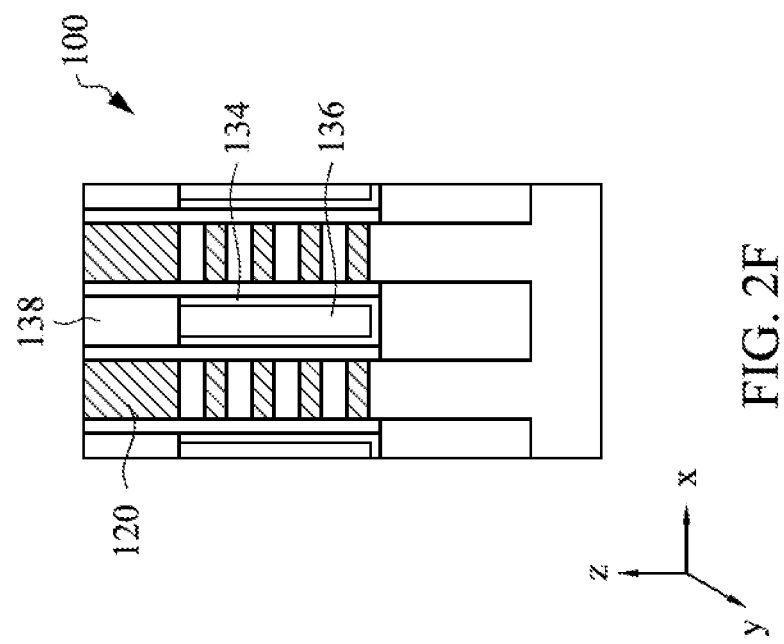
Figure 2E:
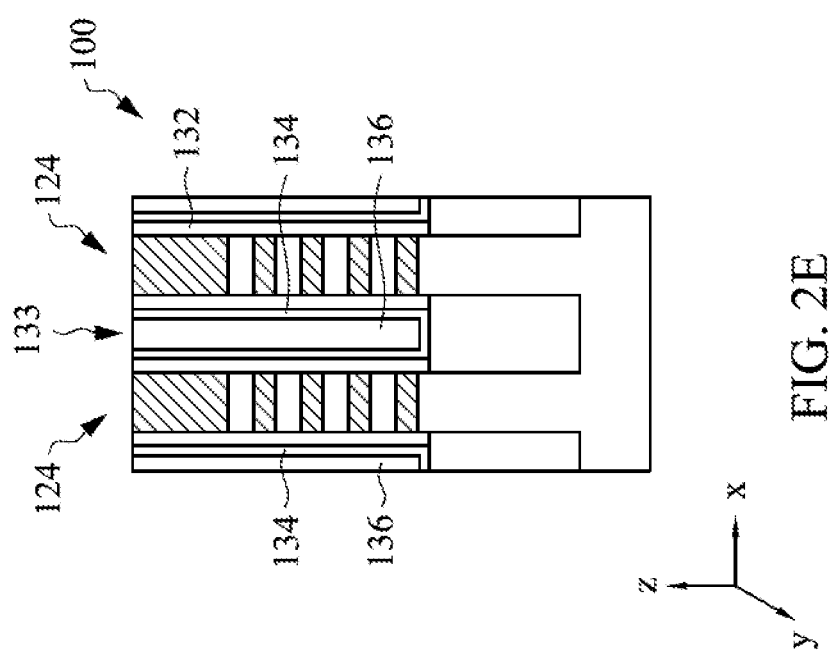
Figure 2H:
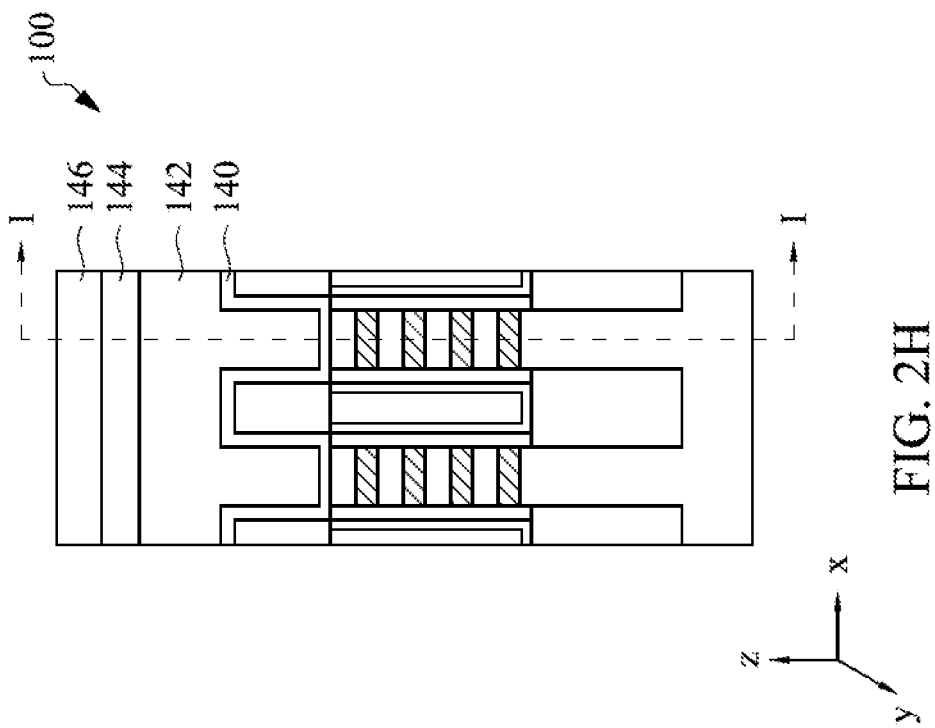
Figure 2G:
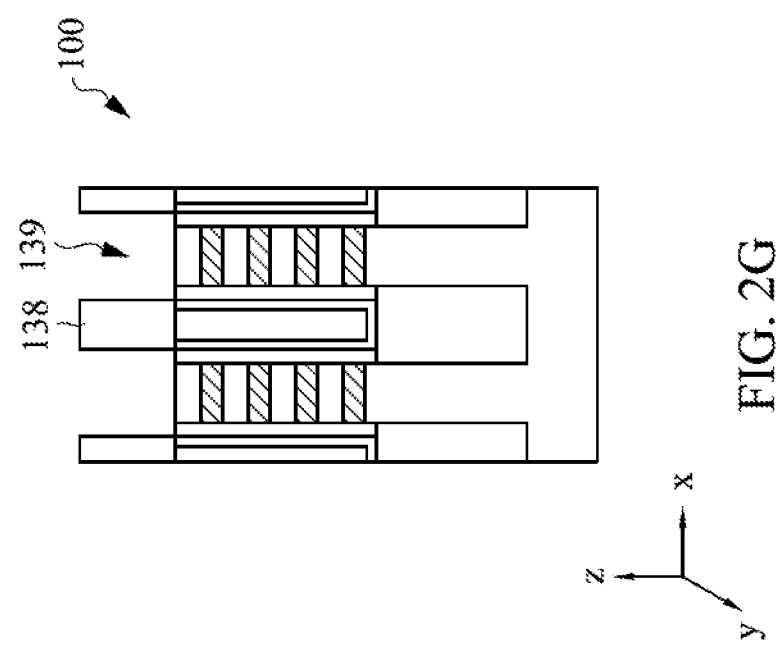
Figure 2J:
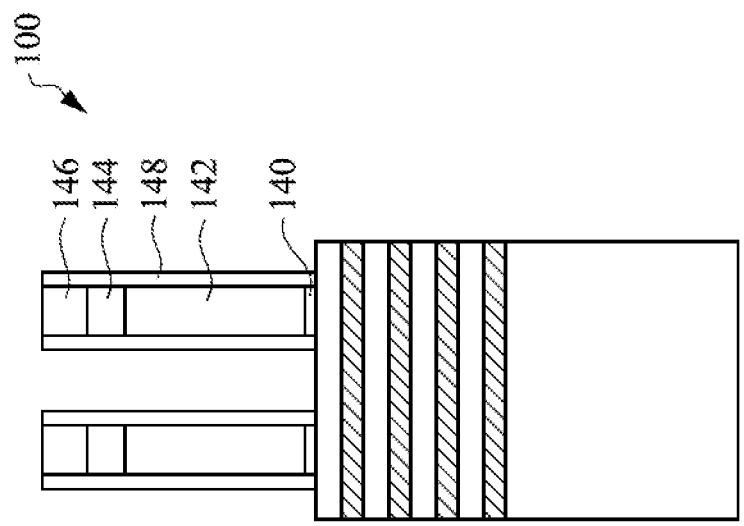
Figure 2I:
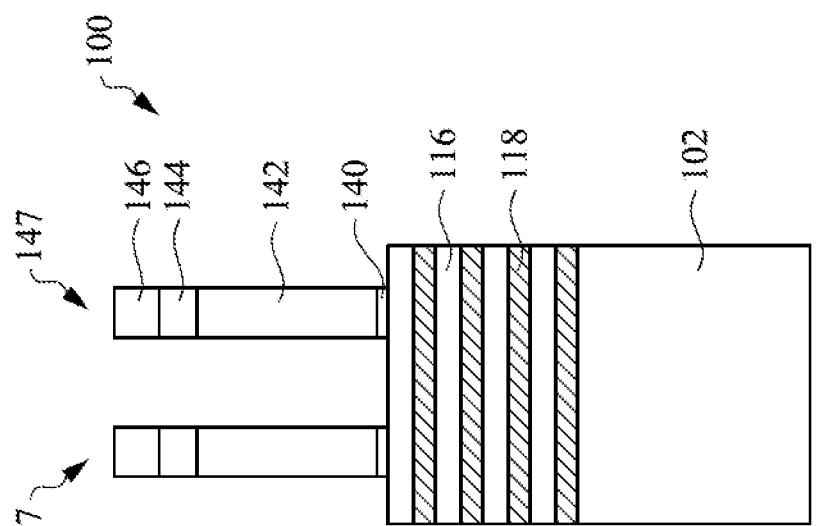
Figure 2L:
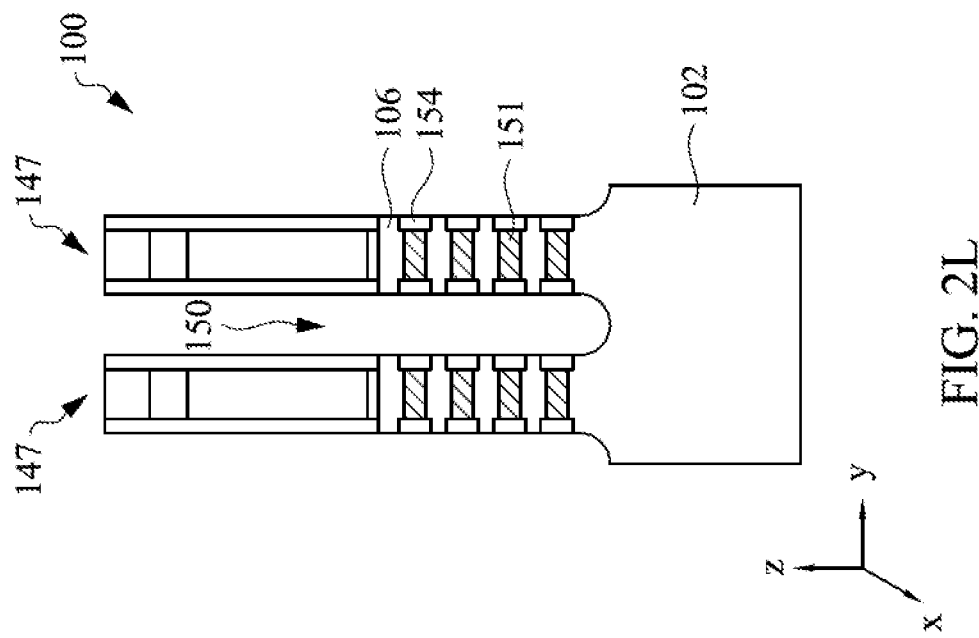
Figure 2K:
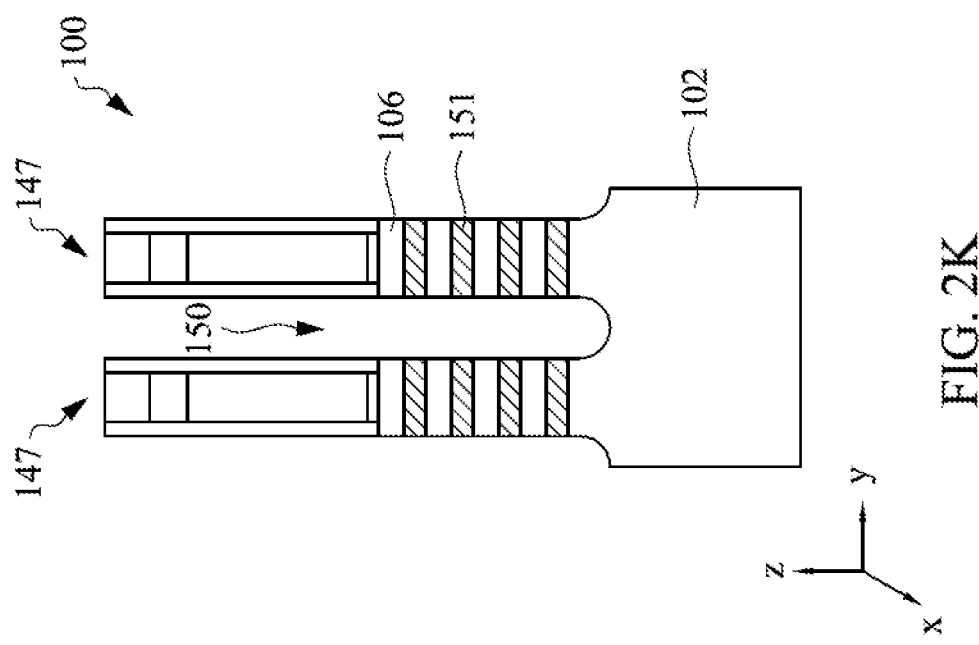
Figure 2N:
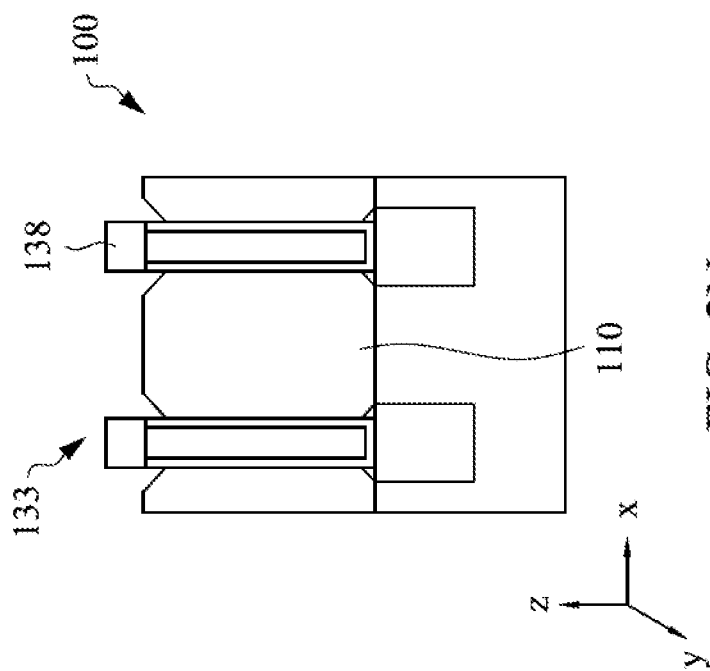
Figure 2M:
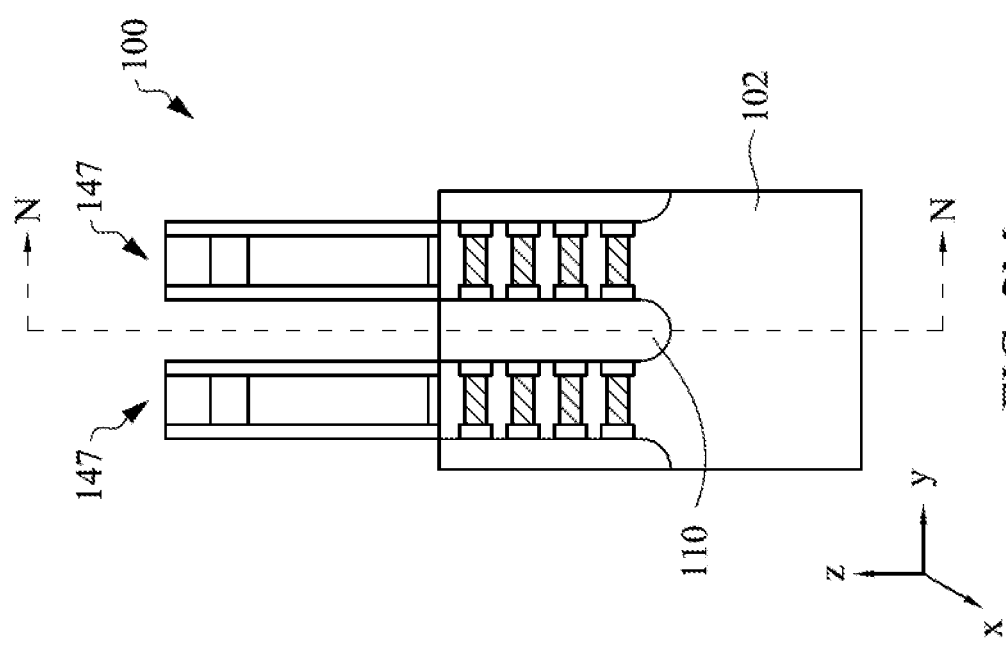
Figure 2P:
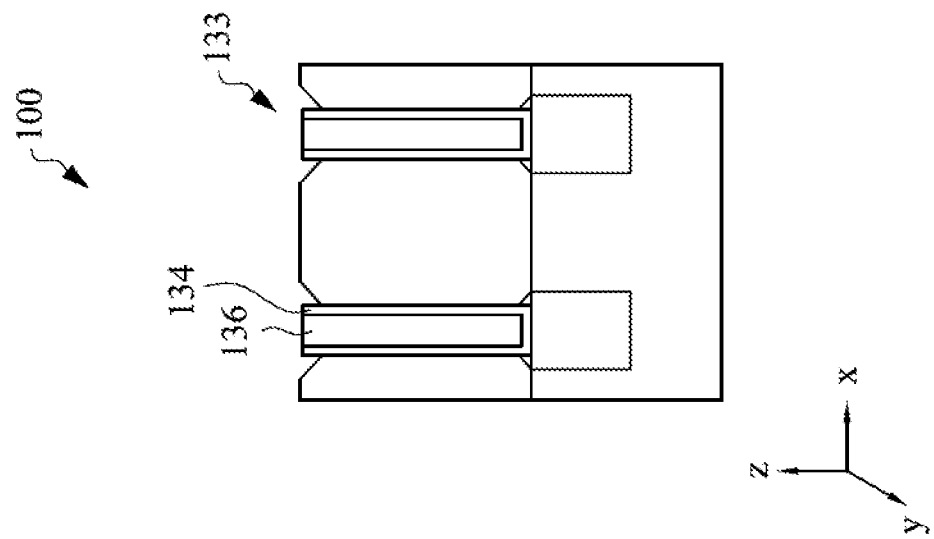
Figure 2O:
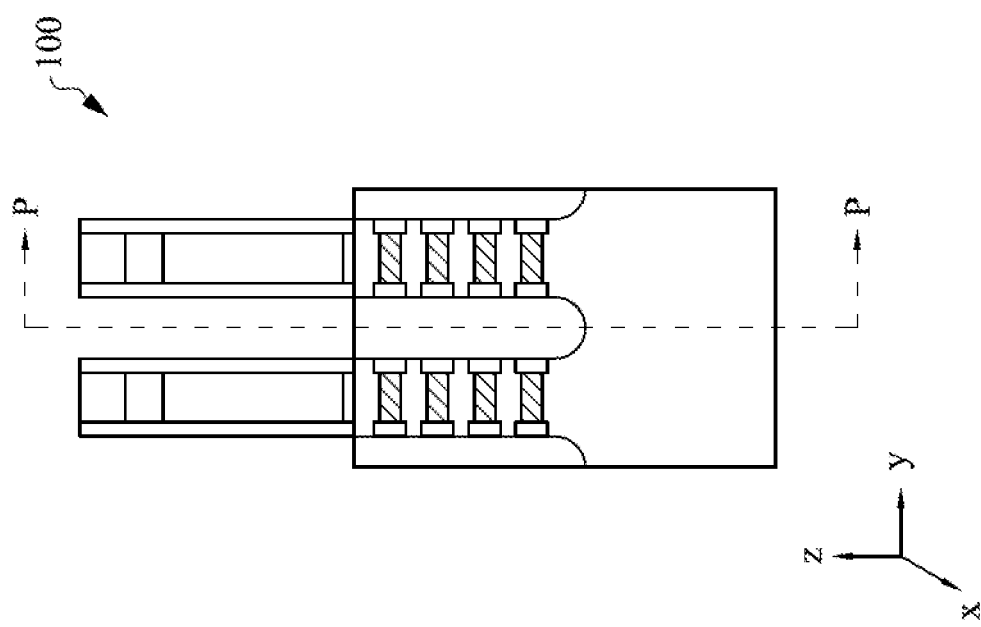
Figure 2R:
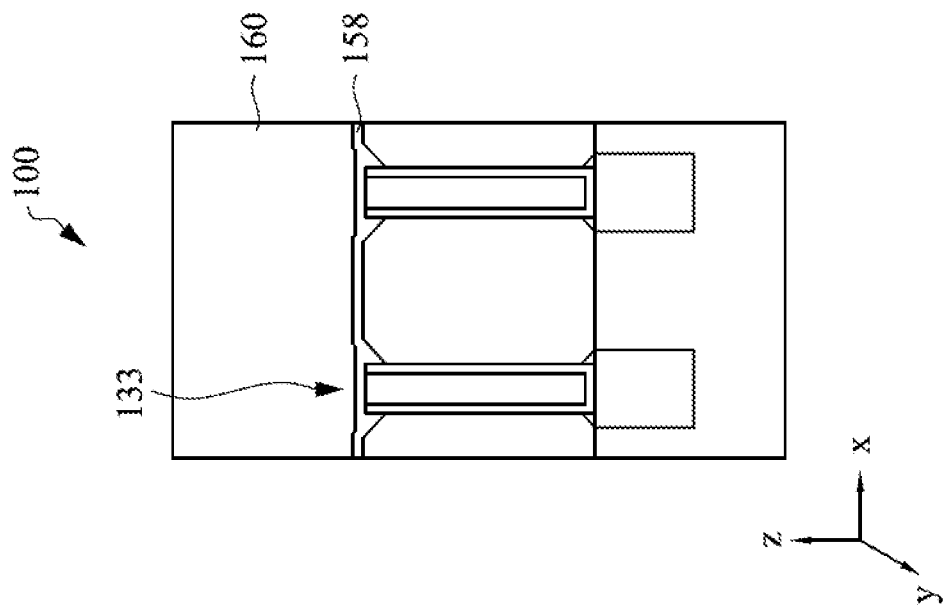
Figure 2Q:
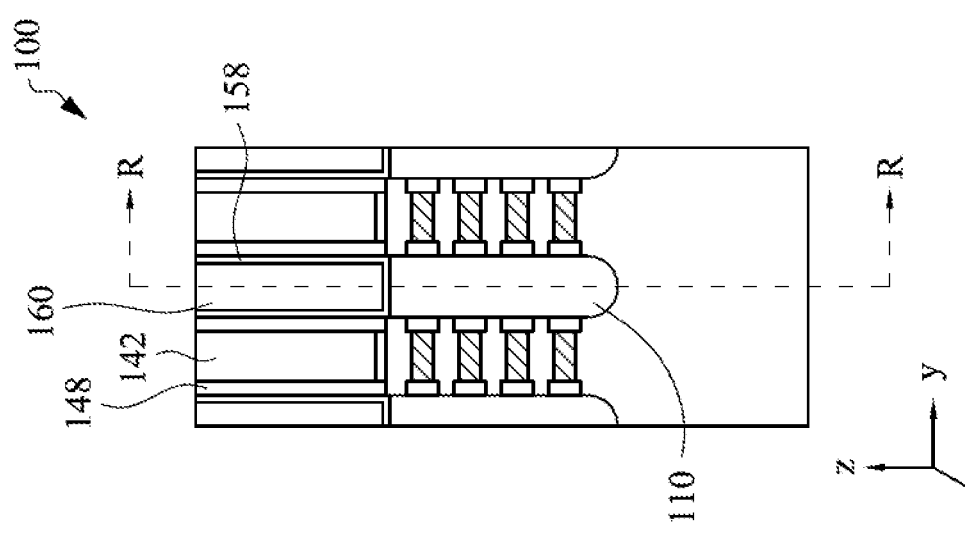
Figure 2T:
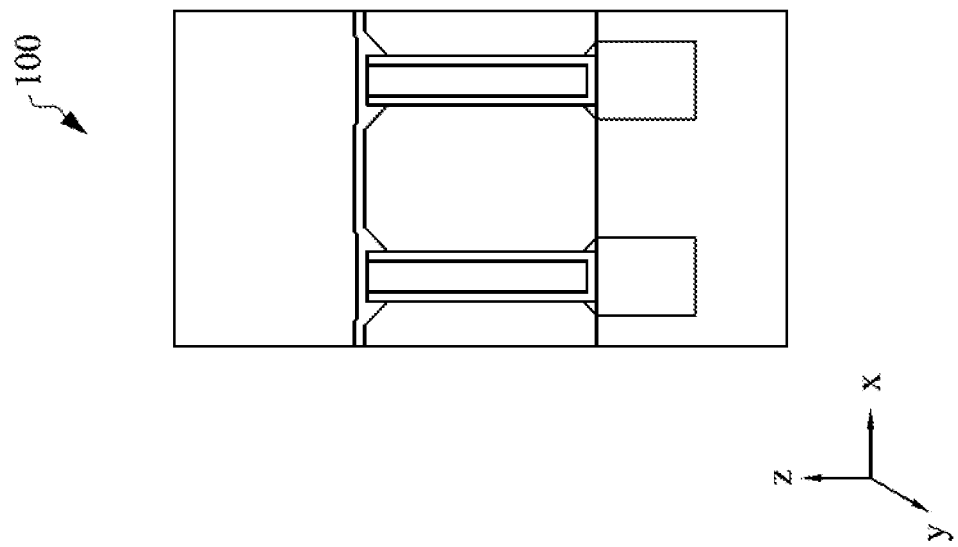
Figure 2S:
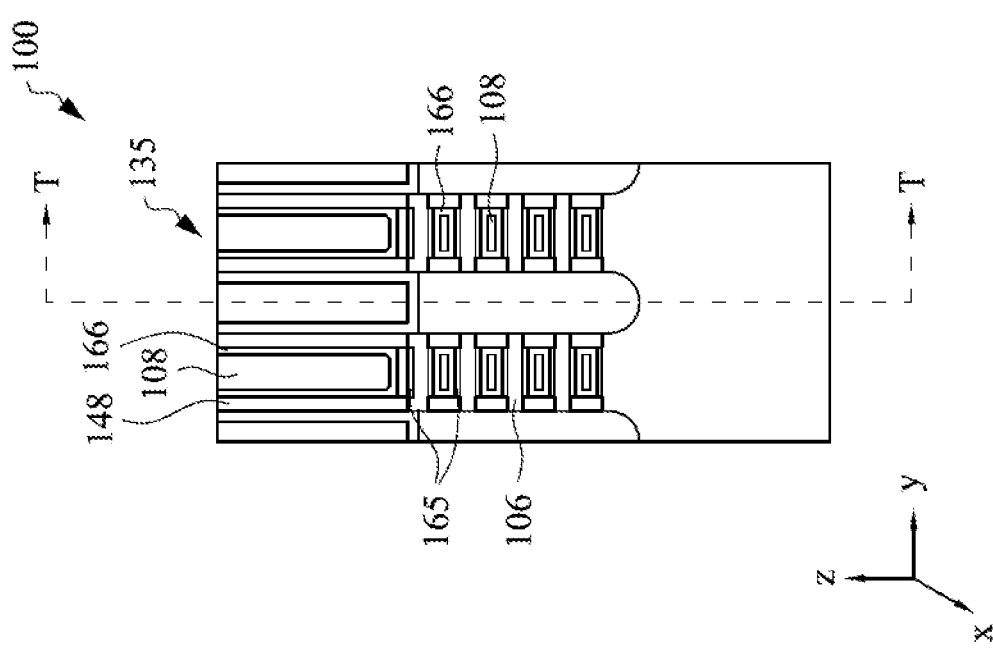
Figure 2V:
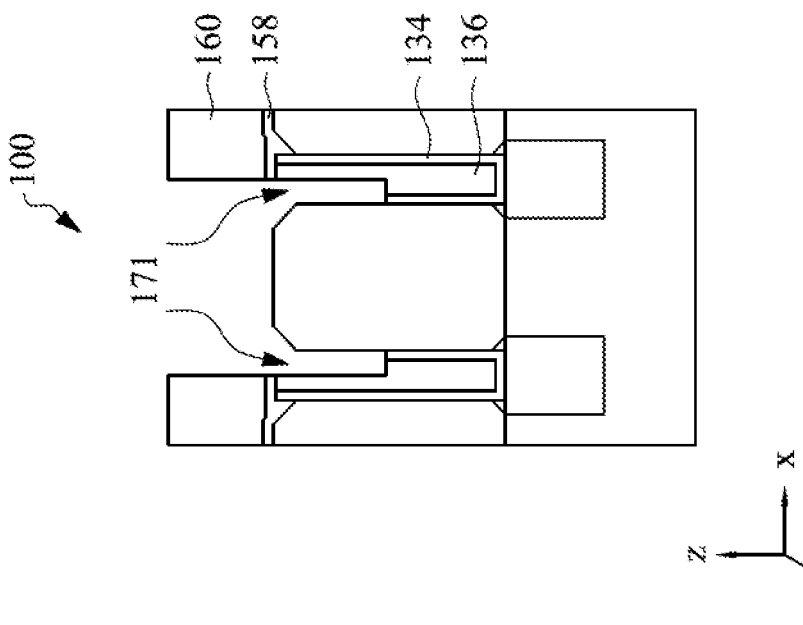
Figure 2U:
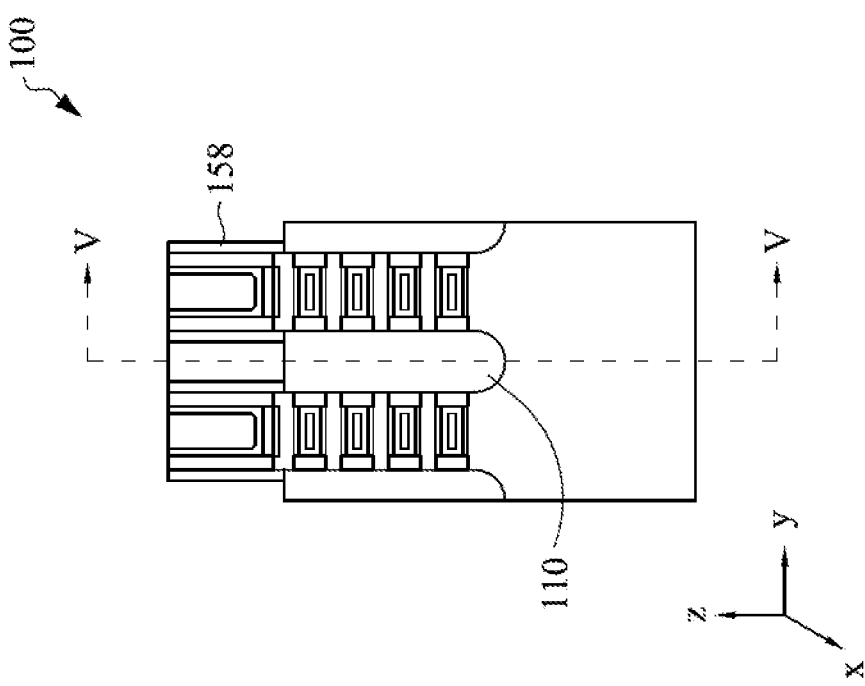
Figure 2X:
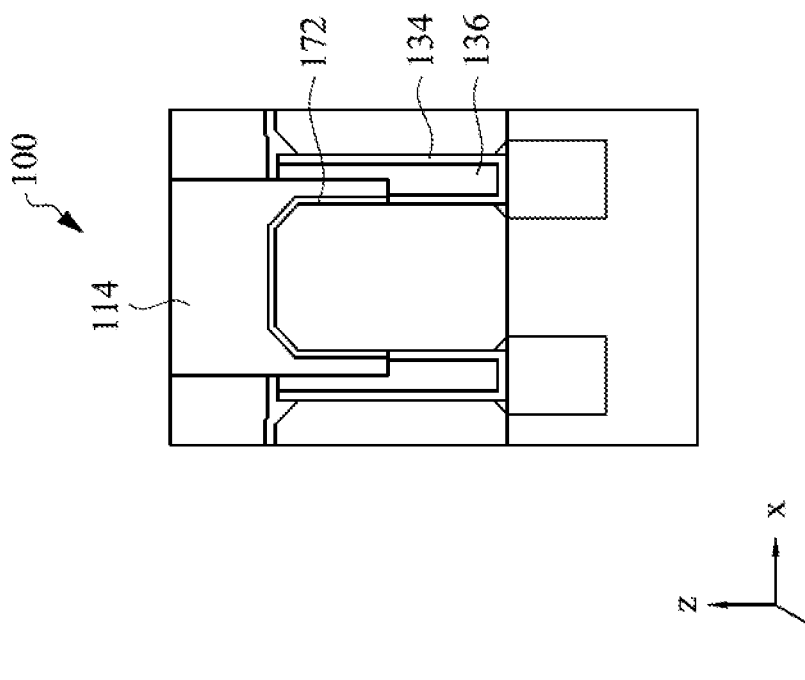

FIGS. 2A-2X also each include axes that indicate the orientation of the cross-sectional view of that figure. The axes include lateral axes X and Y, and vertical axis Z. All axes are mutually orthogonal with each other. Figures in which the X-axis extends from right to left will be referred to as "X-Views." Figures in which the Y-axis goes from right to left will be referred to as "Y-Views."

As shown in FIG. 2A, the semiconductor device 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants may be, for example, boron ($BF_2$) for an n-type transistor and phosphorus for a p-type transistor.

The semiconductor device 100 includes a plurality of semiconductor layers 116, which may form the semiconductor nanostructures 106. The semiconductor nanostructures 106 are layers of semiconductor material. The semiconductor layers 116 are formed over the substrate 102. The semiconductor layers 116 may include one or more layers of Si, Ge, SiGe, GaAs, InSb, GaP, GaSb, InAlAs, InGaAs, GaSbP, GaAsSb or InP. In some embodiments, the semiconductor layers 116 are formed of the same semiconductor material as the substrate 102. Other semiconductor materials can be utilized for the semiconductor layers 116 without departing from the scope of the present disclosure. In a primary non-limiting example described herein, the semiconductor layers 116 and the substrate 102 are silicon.

Sacrificial semiconductor layers 118 are disposed between the semiconductor layers 116. The sacrificial semiconductor layers 118 include a different semiconductor material than the semiconductor layers 116. In an example in which the semiconductor layers 116 include silicon, the sacrificial semiconductor layers 118 may include SiGe. In one example, the silicon germanium sacrificial semiconductor layers 118 may include between 20% and 30% germanium, though other concentrations of germanium can be utilized without departing from the scope of the present disclosure. The concentration of germanium in the silicon germanium sacrificial semiconductor layers 118 is selected to be different than the concentration of germanium in a subsequently formed SiGe sacrificial cladding. The compositions of the sacrificial semiconductor layers 118 and the sacrificial cladding are selected to result in different etching characteristics. The purpose and benefits of this will be described in further detail below.

In some embodiments, the semiconductor layers 116 and the sacrificial semiconductor layers 118 are sequentially and alternately formed, for example, by alternating epitaxial growth processes on the semiconductor substrate 102. For example, a first epitaxial growth process may result in the formation of the lowest sacrificial semiconductor layer 118 on the top surface of the substrate 102. A second epitaxial growth process may result in the formation of the lowest semiconductor layer 116 on the top surface of the lowest sacrificial semiconductor layer 118. A third epitaxial growth process results in the formation of the second lowest sacrificial semiconductor layer 118 on top of the lowest semiconductor layer 116. Alternating epitaxial growth processes may be performed until a selected number of semiconductor layers 116 and sacrificial semiconductor layers 118 have been formed.

A layer 120 is formed on top of the uppermost semiconductor layer 116. In some embodiments, the layer 120 can be a same semiconductor material as the sacrificial semiconductor layers 118. Alternatively, the layer 120 can include a dielectric material or other types of materials. In the example semiconductor device 100 illustrated in FIG. 2A, four semiconductor layers 116 are included. However, in various embodiments, the semiconductor device 100 may include more or fewer semiconductor layers 116. In some embodiments, the semiconductor device 100 may include only a single semiconductor layer 116 that is spaced apart from the substrate 102 by a single sacrificial semiconductor layer 118.

In some embodiments, the vertical thickness of the semiconductor layers 116 may be between 2 nm and 15 nm. In some embodiments, the thickness of the sacrificial semiconductor layers 118 may be between 5 nm and 15 nm. Other thicknesses and materials can be utilized for the semiconductor layers 116 and the sacrificial semiconductor layers 118 without departing from the scope of the present disclosure.

In some embodiments, the sacrificial semiconductor layers 118 correspond to a first sacrificial epitaxial semiconductor region having a first semiconductor composition. In subsequent steps, the sacrificial semiconductor layers 118 will be removed and replaced with other materials and structures. For this reason, the layers 118 are described as sacrificial. As will be described further below, the semiconductor layers 116 will be patterned to form the semiconductor nanostructures 106 of transistors 104.

As shown in FIG. 2B, trenches 126 are formed and extend through the sacrificial semiconductor layers 118, the semiconductor layers 116, and at least partially into the substrate 102. The trenches 126 define fin structures 124, each of which includes a respective stack of semiconductor layers 116 and sacrificial semiconductor layers 118. While FIG. 2B illustrates formation of two fin structures 124, it will be readily appreciated that in various embodiments, more or fewer than two fin structures may be formed in the semiconductor device 100.

The trenches 126 may be formed utilizing any suitable technique. In some embodiments, the trenches 126 may be formed by depositing a hard mask layer on the layer 120. In some embodiments, the layer 120 may itself be a hard mask layer, and in other embodiments a hard mask layer may be formed over the layer 120 and may be patterned and etched using standard photolithography processes. After the hard mask layer has been patterned and etched, portions of the sacrificial semiconductor layers 118, the semiconductor layers 116, and the substrate 102 that are not covered by the hard mask layer are selectively removed, for example, by an etching process. The etching process results in formation of the trenches 126. The etching process can include a single etching step. Alternatively, the etching process can include multiple etching steps. For example, a first etching step can etch the top sacrificial semiconductor layer 118. A second etching step can etch the top semiconductor layer 116. These alternating etching steps may be repeated until all of the sacrificial semiconductor layers 118 and semiconductor layers 116 are etched at the exposed regions. A final etching step may etch at least partially into the substrate 102.

As shown in FIG. 2C, shallow trench isolation regions 130 may be formed in the trenches 126. In some embodiments, an upper surface of the shallow trench isolation regions 130 is disposed below a level of the lowest sacrificial semiconductor layer 118 or below a level of an upper surface of the substrate 102. The shallow trench isolation regions 130 may be formed of any suitable technique. For example, in some embodiments, the shallow trench isolation regions 130 are formed by depositing a dielectric material in the trenches 126 and by recessing the deposited dielectric material so that a top surface of the dielectric material is lower than the lowest sacrificial semiconductor layer 118.

The shallow trench isolation regions 130 can be utilized to separate individual transistors or groups of transistors groups of transistors formed in conjunction with the semiconductor substrate 102. The dielectric material for the shallow trench isolation regions 130 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 130 without departing from the scope of the present disclosure.

As shown in FIG. 2D, a cladding layer 132 may be formed on side surfaces of the fin structures 124. For example, the cladding layer 132 may be deposited on the on the sides of the semiconductor layers 116 and the sacrificial semiconductor layers 118 and on the layer 120. In some embodiments, the cladding layer 132 can be formed by an epitaxial growth from one or more of the semiconductor layers 116, the sacrificial semiconductor layers 118, and the layer 120. Alternatively, the cladding layer 132 can be deposited by a chemical vapor deposition (CVD) process. Other processes can be utilized for depositing the cladding layer 132 without departing from the scope of the present disclosure.

In some embodiments, the cladding layer 132 includes SiGe. In particular, the cladding layer 132 may include SiGe with a different concentration of germanium than the sacrificial semiconductor layers 118. The cladding layer 132 can include other concentrations, materials, or compositions without departing from the scope of the present disclosure.

As shown in FIG. 2E, hybrid fin structures 133 are formed in the gaps between the cladding layers 132. The hybrid fin structures 133 include a first dielectric layer 134 and a second dielectric layer 136.

In some embodiments, the first dielectric layer 134 is formed of a dielectric material, which may be a low-K dielectric material. In some embodiments, the first dielectric layer 134 may include silicon nitride. In some embodiments, the first dielectric layer 134 is formed of a dielectric material, which may include silicon oxide. The first dielectric layer 134 can be deposited on the shallow trench isolation 130 and on side surfaces of the cladding layers 132.

The second dielectric layer 136 can be deposited on the first dielectric layer 134 in the trenches filling the remaining space between the fins 124. The first dielectric layer 134 and the second dielectric layer 136 can be deposited by any suitable technique, including CVD, atomic layer deposition (ALD), or by other suitable deposition processes. After deposition of the first and second dielectric layers 134 and 136, the hybrid fin structures 133 may be planarized by a chemical mechanical planarization (CMP) process. Other materials and deposition processes can be utilized to form the hybrid fin structures 133 without departing from the scope of the present disclosure.

As shown in FIG. 2F, the hybrid fin structures 133 are recessed. For example, an etching process may be performed to recess the top surface of the hybrid fin structures 133. In some embodiments, a timed etch may be performed to reduce the top surface of the hybrid fin structures 133 to a level that is substantially equal to or lower than the bottom of the layer 120. The etching process can include a wet etch, dry etch, or any suitable etch for recessing the hybrid fin structures 133 to a selected depth.

In FIG. 2F, a high-K dielectric layer 138 has been deposited on the hybrid fin structures 133. The high-K dielectric layer 138 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 138 may be formed by CVD, ALD, or any suitable method. A planarization process, such as a CMP process, may be performed to planarize the top surface of the high-K dielectric layer 138. The high-K dielectric layer 138 may be termed a helmet layer for the hybrid fin structures 133. Other processes and materials can be utilized for the high-K dielectric layer 138 without departing from the scope of the present disclosure.

As shown in FIG. 2G, portions of the layer 120 and to recess the cladding layer 132 are selectively removed. For example, in some embodiments, an etching process may be performed to remove the layer 120 and to recess the cladding layer 132. The etching process can be performed in one or more steps. The one or more steps selectively etch the layer 120 and the materials of the cladding layer 132 with respect to the material of the high-K dielectric layer 138. Accordingly, in FIG. 2G, the high-K dielectric layer 138 remains protruding above substantially unchanged while other layers have been recessed or removed. The one or more etching steps can include wet etches, dry etches, timed etches, or other types of etching processes.

As shown in FIG. 2H, a thin dielectric layer 140 has been deposited on the top surface of the cladding layer 132, the top semiconductor layer 116, and on the high-K dielectric layer 138. In some embodiments, the thin dielectric layer 140 may have a thickness between 1 nm and 5 nm. The thin dielectric layer 140 may be formed of any dielectric material, and in some embodiments, the thin dielectric layer 140 may include silicon oxide. Other materials, deposition processes, and thicknesses can be utilized for the thin dielectric layer 140 without departing from the scope of the present disclosure.

In FIG. 2H, a polysilicon layer 142 has been deposited on the dielectric layer 140. The polysilicon layer 142 may have a thickness between 20 nm and 100 nm. The polysilicon layer 142 may be formed by any suitable technique, including by an epitaxial growth, a CVD process, a physical vapor deposition (PVD) process, or an ALD process. Other thicknesses and deposition processes can be used for depositing the polysilicon layer 142 without departing from the scope of the present disclosure.

In FIG. 2H, a dielectric layer 144 has been formed, e.g., by deposition, on the polysilicon layer 142. A dielectric layer 146 has been formed on the dielectric layer 144. In one example, the dielectric layer 144 includes silicon nitride. In one example, the dielectric layer 146 includes silicon oxide. The dielectric layers 144 and 146 can be deposited by CVD in some embodiments, although any suitable technique for forming the dielectric layers 144, 146 may be utilized in various embodiments. The dielectric layer 144 can have a thickness between 5 nm and 15 nm in some embodiments. The dielectric layer 146 can have a thickness between 15 nm and 50 nm in some embodiments. Other thicknesses, materials, and deposition processes can be utilized for the dielectric layers 144 and 146 without departing from the scope of the present disclosure.

The dielectric layers 144 and 146 may be patterned and etched to form a mask for the polysilicon layer 142. The dielectric layers 144 and 146 can be patterned and etched using standard photolithography processes. After the dielectric layers 144 and 146 have been patterned and etched to form the mask, the polysilicon layer 142 is etched so that only the polysilicon directly below the dielectric layers 144 and 146 remains. The resulting structure is a polysilicon fin.

FIG. 2I is a cross-sectional view of the semiconductor device 100 taken along cut line I shown in FIG. 2H. In FIGS. 2A-2H the X-axis is the lateral axis going left to right on the drawing sheet, while the Y-axis goes in and out of the sheet. In FIGS. 2J through 2L, the Y-axis is the lateral axis going left to right on the sheet, while the X-axis goes in and out of the sheet.

As shown in FIG. 2I, the layers 146, 144, 142, and 140 have been patterned and etched to form dummy gate structures 147. Formation of the dummy gate structures 147 can be accomplished using standard photolithography processes including forming a photoresist mask in the desired pattern of the dummy gate structures 147 and then performing an etching process in the presence of the mask. The photolithography process can also include formation of a hard mask.

As shown in FIG. 2J, a gate spacer layer 148 has been deposited on the top surfaces of the top semiconductor layer 116, as well as on the sides thin dielectric layer 140, the polysilicon layer 142, and the dielectric layers 144 and 146. In one example, the gate spacer layer 148 includes SiCON. The gate spacer layer 148 can be deposited by CVD, PVD, or ALD. Other materials and deposition processes can be utilized for the gate spacer layer 148 without departing from the scope of the present disclosure.

As shown in FIG. 2K, recesses 150 are formed extending through the semiconductor layers 116, the sacrificial semiconductor layers 118, and at least partially into the substrate 102. The recesses 150 may be formed by any suitable technique, including by selectively removing portions of the semiconductor layers 116, the sacrificial semiconductor layers 118, and the substrate 102. In some embodiments, the recesses 150 may be formed by etching the semiconductor layers 116, the sacrificial semiconductor layers 118, and the substrate 102 using the dummy gate structures 147 as a mask. The formation of recesses 150 concurrently forms or defines the semiconductor nanostructures 106 from the remaining portions of the semiconductor layers 116. Similarly, sacrificial semiconductor nanostructures 151 are formed or defined by the remaining portions of the sacrificial semiconductor layers 118.

Each dummy gate structure 147 corresponds to a position at which a transistor 104 will be formed. More particularly, gate electrodes 108 will eventually be formed in place of the dummy gate structures 147 and the sacrificial semiconductor nanostructures 151. Each stack of semiconductor nanostructures 106 will correspond to the channel regions of a respective transistor 104. FIG. 2K illustrates the locations of two transistors 104. The two transistors 104 will share a common source/drain region 110 as will be set forth in further detail below.

As shown in FIG. 2L, lateral portions of the sacrificial semiconductor nanostructures 151 are removed and replaced with inner spacers 154. The lateral portions of the sacrificial semiconductor nanostructures 151 may be removed by any suitable technique, including, for example, by an etching process to laterally recess the sacrificial semiconductor nanostructures 151 with respect to the semiconductor nanostructures 106. The etching process can be performed by a chemical bath that selectively etches the sacrificial semiconductor nanostructures 151 with respect to the semiconductor nanostructures 106. The etching process is timed so that the sacrificial semiconductor nanostructures 151 are recessed but not entirely removed. The recessing process is utilized to enable the formation of an inner spacer layer between the semiconductor nanostructures 106 at the locations where the sacrificial semiconductor nanostructures 151 have been recessed.

The inner spacers 154 are formed by any suitable technique (e.g., by deposition) at the sides of the semiconductor nanostructures 106. The inner spacers 154 can be deposited by an ALD process, a CVD process, or other suitable processes. In one example, the inner spacers 154 includes silicon nitride.

FIG. 2M is a Y-view of the semiconductor device 100, and FIG. 2N is an X-view of the semiconductor device 100 taken along the cut line N of FIG. 2M.

As shown in FIG. 2M source/drain regions 110 have been formed. The source/drain regions 110 include semiconductor material. In some embodiments, the source/drain regions 110 may be grown epitaxially from the semiconductor nanostructures 106. The source/drain regions 110 can be epitaxially grown from the semiconductor nanostructures 106 and from the substrate 102. The source/drain regions 110 can be doped with N-type dopants species in the case of N-type transistors, and can be doped with P-type dopant species in the case of P-type transistors. The doping can be performed in-situ during the epitaxial growth. In some embodiments, the source/drain regions 110 may have a thickness between 2 nm and 10 nm. The source/drain regions 110 may be in direct contact with the semiconductor nanostructures 106.

As shown in FIG. 2N, the source/drain regions 110 extend between adjacent hybrid fin structures 133. In some embodiments, the source/drain regions 110 may have a top surface that extends to a level that is higher than a level of an upper surface of the hybrid fin structures 133. As shown, the high-K dielectric layer 138 may remain on the hybrid fin structures 133 during formation of the source/drain regions 110.

FIG. 2O is a Y-view of the semiconductor device 100, and FIG. 2P is an X-view of the semiconductor device 100 taken along the cut line P of FIG. 2O. As shown in FIG. 2P, the high-K dielectric layer 138 is removed. The high-K dielectric layer 138 may be removed by any suitable process, which in some embodiments may include by an etching process. After removal of the high-K dielectric layer 138, upper surfaces of the hybrid fin structures 133 are exposed. For example, upper surfaces of the first and second dielectric layers 134, 136 may be exposed by the removal of the high-K dielectric layer 138.

FIG. 2Q is a Y-view of the semiconductor device 100, and FIG. 2R is an X-view of the semiconductor device 100 taken along the cut line R of FIG. 2Q.

As shown in FIG. 2Q, a dielectric layer 158 has been deposited on sidewalls of the gate spacer layers 148 and on top of the source/drain regions 110. The dielectric layer 158 can include silicon nitride or another suitable material and can be deposited by ALD, CVD, or PVD. A dielectric layer 160 has been deposited on the dielectric layer 158. The dielectric layer 160 can include silicon oxide or another suitable material and can be deposited by ALD, CVD, or PVD. Other materials and deposition processes can be utilized for the dielectric layers 158 and 160 without departing from the scope of the present disclosure.

As shown in FIG. 2P, the dielectric layers 158 and 160 are deposited on the hybrid fin structures 133.

In some embodiments, the semiconductor device 100 may be planarized, for example by CMP, resulting in a planarized upper surface. The planarization may remove the dielectric layers 144 and 146, and may remove corresponding portions of the gate spacer layer 148. The planarization may expose an upper surface of the polysilicon layer 142. In some embodiments, upper surfaces of the dielectric layers 158 and 160, the gate spacer layer 148, and the polysilicon layer 142 may be substantially coplanar with one another.

FIG. 2S is a Y-view of the semiconductor device 100, and FIG. 2T is an X-view of the semiconductor device 100 taken along the cut line T of FIG. 2S.

As shown in FIG. 2S, a metal gate 135 is formed, and the metal gate 135 includes a gate electrode 108 and a gate dielectric layer 166. Further, as shown in FIG. 2S, the dummy gates 147 have been removed. The dummy gates 147 may be removed by any suitable technique, and in some embodiments, the dummy gates 147 may be removed by one or more etching steps. The etching steps may include etching steps to remove the dielectric layer 146, then the dielectric layer 144, then the polysilicon layer 142, then the dielectric layer 140. Various other processes can be performed to remove the dummy gate structures 147 without departing from the scope of the present disclosure.

As shown in FIG. 2S, the sacrificial semiconductor nanostructures 151 have been removed. The sacrificial semiconductor nanostructures 151 can be removed after removal of the dummy gates 147. The sacrificial semiconductor nanostructures 151 can be removed with an etching process that selectively etches the sacrificial semiconductor nanostructures 151 with respect to the semiconductor nanostructures 106 and the inner spacers 154. Various other processes can be utilized to remove the sacrificial semiconductor nanostructures 151 without departing from the scope of the present disclosure.

As shown in FIG. 2S, an interfacial dielectric layer 165 is formed on exposed surfaces of the semiconductor nanostructures 106. The interfacial dielectric layer 165 may be formed by any suitable technique, including, for example, by a deposition process.

The interfacial dielectric layer 165 may include a dielectric material such as silicon oxide, silicon nitride, or other suitable dielectric materials. The interfacial dielectric layer 165 may include a comparatively low-K dielectric with respect to high-K dielectric such as hafnium oxide or other high-K dielectric materials that may be used in gate dielectrics of transistors.

The interfacial dielectric layer 165 may be formed by a thermal oxidation process, a chemical vapor deposition (CVD) process, or an atomic layer deposition (ALD) process. In some embodiments, the interfacial dielectric layer 165 may have a thickness between 0.5 nm and 2 nm. One consideration in selecting a thickness for the interfacial dielectric layer is to leave sufficient space between the nanosheets 106 for gate metals, as will be explained in more detail below. Other materials, deposition processes, and thicknesses can be utilized for the interfacial dielectric layer without departing from the scope of the present disclosure.

As shown in FIG. 2S, a gate dielectric is formed. The gate dielectric may include the interfacial dielectric layer 165 and a high-K gate dielectric layer 166 positioned on the interfacial dielectric layer 165. Together, the interfacial dielectric layer 165 and the high-K gate dielectric layer 166 form a gate dielectric for the gate all around nanosheet transistors.

The high-K gate dielectric layer 166 and the interfacial dielectric layer 165 physically separate the semiconductor nanostructures 106 from the gate metals that will be deposited in subsequent steps. The high-K gate dielectric layer 166 and the interfacial dielectric layer 165 isolate the gate metals from the semiconductor nanostructures 106 that correspond to the channel regions of the transistors.

The high-K gate dielectric layer 166 may include one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer 166 may be formed by CVD, ALD, or any suitable method. In some embodiments, the high-K gate dielectric layer 166 is formed using a highly conformal deposition process such as ALD in order to ensure the formation of a gate dielectric layer having a uniform thickness around each semiconductor nanosheet 106. In some embodiments, the thickness of the high-k dielectric 166 is in a range from about 1 nm to about 3 nm. Other thicknesses, deposition processes, and materials can be utilized for the high-K gate dielectric layer 166 without departing from the scope of the present disclosure. The high-K gate dielectric layer 166 may include a first layer that includes $HfO_2$ with dipole doping including La and Mg, and a second layer including a higher-K ZrO layer with crystallization.

After forming the gate dielectric by, for example, deposition of the high-K gate dielectric layer 166, the gate electrode 108 is formed, for example, by depositing a gate metal in the voids formed by removal of the dummy gate structures 147. The gate electrode 108 surrounds the semiconductor nanostructures 106. In particular, the gate electrode 108 is in contact with the gate dielectric, e.g., with the high-K gate dielectric layer 166. The gate electrode 108 is positioned between semiconductor nanostructures 106. In other words, the gate electrode 108 is positioned all around the semiconductor nanostructures 106. For this reason, the transistors formed in relation to the semiconductor nanostructures 106 are called gate all around transistors.

Although the gate electrode 108 is shown as a single metal layer, in practice the gate electrode 108 may include multiple metal layers. For example, the gate electrode 108 may include one or more very thin work function layers in contact with the gate dielectric. The thin work function layers can include titanium nitride, tantalum nitride, or other conductive materials suitable for providing a selected work function for the transistors. The gate electrode 108 can further include a gate fill material that corresponds to the majority of the gate electrode 108. The gate fill material can include cobalt, tungsten, aluminum, or other suitable conductive materials. The layers of the gate electrode 108 can be deposited by PVD, ALD, CVD, or other suitable deposition processes.

In some embodiments, one or more conductive layers may be formed on the gate electrodes 108. For example, a metal layer (not shown) may be formed (e.g., by deposition)

on the gate electrodes 108. The metal layer can include tungsten, aluminum, titanium, copper, gold, tantalum, or other suitable conductive materials. The metal layer can be deposited by ALD, PVD, or CVD. Other materials and deposition processes can be utilized for the metal layer. In some embodiments, a cap layer (not shown) may be formed on the metal layer, for example, by deposition. The cap layer can include one or more of SiCN, SiN, or SICON. The cap layer can be deposited by CVD, ALD, or other suitable processes.

FIG. 2U is a Y-view of the semiconductor device 100, and FIG. 2V is an X-view of the semiconductor device 100 taken along the cut line V of FIG. 2U.

As shown in FIGS. 2U and 2V, portions of the dielectric layer 160, the dielectric layer 158, the first dielectric layer 134, and the second dielectric layer 136 are removed. The layers may be removed by any suitable process. For example, in some embodiments, an etching process may be performed to remove the portions of the dielectric layer 160, the dielectric layer 158, the first dielectric layer 134, and the second dielectric layer 136. The etching process can be performed in one or more steps. The one or more steps selectively etch the portions of the dielectric layer 160, the dielectric layer 158, the first dielectric layer 134, and the second dielectric layer 136 with respect to the material of the source/drain regions 110. Accordingly, as shown in FIG. 2V, portions of the source/drain regions 110 remain protruding substantially unchanged while corresponding lateral portions of the first and second dielectric layers 134, 136 have been removed. The one or more etching steps can include wet etches, dry etches, timed etches, or other types of etching processes.

Gaps 171 are formed between the side surfaces of the first dielectric layer 134 of the hybrid fin structures 133 and side surfaces of the source/drain regions 110, as shown in FIG. 2V. In some embodiments, the gaps 171 may extend along the side surfaces of the source/drain regions 110 to a level that is deeper than at least one-half of the height of the source/drain regions 110. For example, as shown in FIG. 2V, the source/drain regions 110 may have side surfaces that are exposed by the gaps 171 for at least one-half of the height of the source/drain regions 110.

Upper surfaces of the source/drain regions 110 may be exposed by the removal of the portions of the dielectric layer 160, the dielectric layer 158, the first dielectric layer 134, and the second dielectric layer 136, as shown.

Figure 2W:
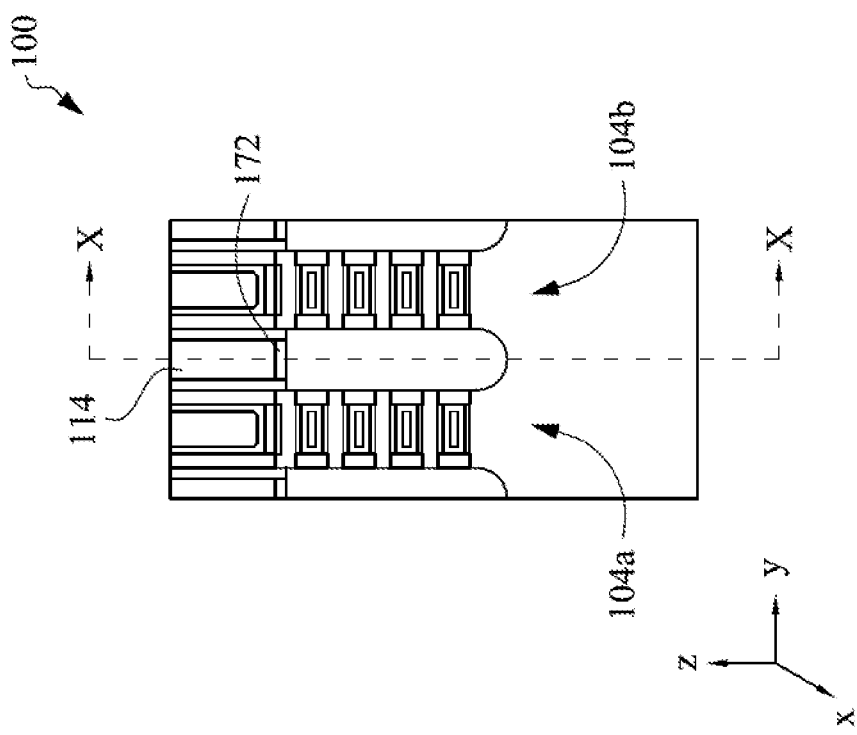

FIG. 2W is a Y-view of the semiconductor device 100, and FIG. 2X is an X-view of the semiconductor device 100 taken along the cut line X of FIG. 2W.

As shown in FIGS. 2W and 2X, a silicide 172 has been formed on the source/drain regions 110. The silicide 172 is formed on top of the source/drain regions 110 and on side surfaces of the source/drain regions 110 in the gaps 171. The silicide 172 extends over top surfaces of the source/drain regions 110 and extends along the side surfaces of the source/drain regions 110. In some embodiments, the silicide 172 may be a "wrap around" silicide that covers and contacts at least the top surface and two side surfaces of each of the source/drain regions 110. This increases a contact area between the silicide 172 and the source/drain regions 110. In some embodiments, the silicide 172 contacts an upper surface of the first dielectric layer 134 in the gaps 171.

The silicide 172 can include any suitable silicide. In some embodiments, the silicide 172 includes one or more of titanium silicide, cobalt silicide, ruthenium silicide, aluminum silicide, nickel silicide, or other silicides. The silicide 172 may be formed using any suitable technique. In some embodiments, the silicide 172 can be grown by performing a high-temperature annealing process in the presence of the metal and the silicon from which the silicide 172 is formed. The result of the silicide growth process is that silicide 172 grows from all exposed surfaces of the source/drain regions 110. The silicide 172 can include other materials and deposition processes without departing from the scope of the present disclosure.

The contact between the wrap around silicide 172 and the source/drain regions 110 reduces a contact resistance along a current path through the source/drain regions 110 to the semiconductor nanostructures 106, as the relatively high resistance source/drain material is substantially surrounded (e.g., along at least three sides in some embodiments) by the highly conductive silicide 172. Further details regarding the benefits of the silicide 172 will be discussed below.

In some embodiments, the silicide 172 has a thickness (e.g., along the X-axis direction) between 1 nm and 10 nm. In some embodiments, the silicide 172 has a thickness (e.g., along the X-axis direction) between 3 nm and 10 nm. The silicide 172 can have other dimensions and shapes without departing from the scope of the present disclosure.

As shown in FIGS. 2W and 2X, source/drain contacts 114 have been formed on the silicide 172. The source/drain contacts 114 can include conductive material such as tungsten, cobalt, copper, titanium, aluminum, or other suitable conductive materials by which voltages can be applied to the source/drain regions 110. The source/drain contacts 114 can be formed by PVD, CVD, ALD, or other suitable deposition processes. Other materials and deposition processes can be utilized for the source/drain contacts 114 without departing from the scope of the present disclosure.

As shown in FIG. 2X, the source/drain contacts 114 may substantially fill the gaps 171 and may extend laterally between a side surface of the silicide 172 (e.g., which is on a side surface of the source/drain region 110) and a side surface of the second dielectric layer 136 that is formed by the removal of portions of the second dielectric layer 136. In some embodiments, the source/drain contacts 114 may contact a surface (e.g., a recessed upper surface) of the first and second dielectric layers 134, 136 at a level that is below a level of the upper surface of the source/drain region 110, as shown.

The semiconductor device 100 shown in FIGS. 2W and 2X illustrate the transistors 104*a*, 104*b* after processing of the transistors 104*a*, 104*b* is complete. As such, FIGS. 2W and 2X correspond with FIGS. 1A and 1B. The first transistor 104*a* includes the semiconductor nanostructures 106 and the gate electrode 108 on the left side. The second transistor 104*b* includes the semiconductor nanostructures 106 and the gate electrode 108 on the right side. The first and second transistors 104*a* and 104*b* share a central source/drain region 110. The source/drain region 110 on the left is a source/drain region 110 of the transistor 104*a*. The source/drain region 110 on the right is a source/drain region 110 of the transistor 104*b*.

The gate all around transistors 104*a*, 104*b* function by applying biasing voltages to the gate electrode 108 and to the source and drain contacts 114. The biasing voltages cause a channel current to flow through the semiconductor nanostructures 106 between the source/drain regions 110. Accordingly, the semiconductor nanostructures 106 correspond to channel regions of the gate all around transistors 104*a*, 104*b*.

The formation of the wrap around silicide 172 results in various benefits. In one example, when a transistor 104*a*, 104*b* is enabled, current flows from a source/drain contact 114 through the silicide 172, through the source/drain region 110 and into the semiconductor nanostructures 106.

Current that flows through the bottom semiconductor nanostructure 106 has a longer path than current that flows through the top semiconductor nanostructure 106. In a situation in which the silicide 172 does not extend downward along the lateral side surfaces of the source/drain regions 110, then current that flows through the bottom semiconductor nanostructure 106 will take a relatively long path through the source/drain regions 110. The source/drain regions 110 are not as conductive as the silicide 172. Accordingly, a longer path through the source/drain regions 106 corresponds to a larger electrical resistance, greater power dissipation, and greater heat generation. However, the transistors 104a, 104b of FIGS. 1A and 1B include silicide 172 that extends downward along the lateral side surfaces of the source/drain regions 110. The result is that there is a relatively small distance between the lowest semiconductor nanostructures 106 and the silicide 172. Because the silicide 172 is highly conductive compared to the source/drain regions 110, current that flows through the lowest nanostructures 106 will primarily flow through the path of least resistance downward through the silicide 172 and then laterally through the source/drain regions 110 to the lowest nanostructures 106. This reduces the overall resistance, power dissipation, and heat generation in comparison to a situation in which the silicide 172 is positioned only and the top surfaces of the source/drain regions 110.

Moreover, since the silicide 172 extends into a recessed region at which the hybrid fin structures 133 are laterally recessed, a lateral width of the transistors (e.g., along the X-axis direction) may be reduced. That is, additional space is not provided for the silicide 172, since the silicide 172 may be disposed within the recessed portion of the hybrid fin structures 133. Indeed, as shown in FIGS. 1B and 2X, a portion of the sides of the source/drain regions 110 contact lower side surface portions of the first dielectric layer 134 of the hybrid fin structures 133. As such, the hybrid fin structures 133 are not entirely spaced laterally apart from the source/drain regions 110 in order to accommodate the silicide 172, but instead, the silicide 172 may be disposed in the recessed portion of the hybrid fin structures 133.

Embodiments of the present disclosure provide a semiconductor device having improved performance due at least in part to a reduced electrical resistance through source/drain regions. In some embodiments, the semiconductor device includes one or more nanostructure transistors having a plurality of semiconductor nanostructures arranged in a stack overlying a substrate. The nanostructures act as channel regions of the nanostructure transistor. Each nanostructure transistor includes source/drain regions in contact with the nanostructures. A silicide is formed on the source/drain regions and may wrap around or contact at least three surfaces (e.g., an upper and opposite side surfaces) of the source/drain regions. The silicide contacts an intermediate or recessed surface of a dielectric fin structure that is disposed adjacent to and in contact with the source/drain regions. Source/drain contacts are disposed in contact with the silicide and with the intermediate surface of the dielectric fin structure. As such, there is a relatively small distance between each nanostructure and the silicide.

Due to the presence of the wrap around silicide, the electrical resistance between the lowest nanostructures and the silicide is greatly reduced with respect to configurations in which the silicide is formed only at the top of the source/drain regions, resulting in reduced power consumption. Moreover, a large number of nanostructures can be formed without negatively impacting the electrical resistance between lower nanostructures and the silicide. With larger numbers of nanostructures, currents can be conducted through nanostructure transistors without generating excessive amounts of heat. Accordingly, a semiconductor device in accordance with principles of the present disclosure consumes less power and generates less heat. The reduction in heat can also prevent damage to the semiconductor device from overheating. Thus, principles of the present disclosure provide substantial benefits to transistor function and overall semiconductor device function.

In one or more embodiments, a device includes a substrate and a first channel region of a first transistor overlying the substrate. A source/drain region is adjacent to the first channel region along a first direction and is disposed in contact with the first channel region. The source/drain region has a first surface opposite the substrate and side surfaces extending from the first surface. A dielectric fin structure is adjacent to the source/drain region along a second direction that is transverse to the first direction, and the dielectric fin structure has an upper surface, a lower surface, and an intermediate surface that is disposed between the upper and lower surfaces. A silicide layer is disposed on the first surface and the side surfaces of the source/drain region and on the intermediate surface of the dielectric fin structure.

In one or more embodiments, a method includes forming a first channel region of a first transistor. A source/drain region is formed in contact with the first channel region, and the source/drain region is adjacent to the first channel region along a first direction. A dielectric fin structure is formed adjacent to the source/drain region along a second direction that is transverse to the first direction. The dielectric fin structure has an upper surface, a lower surface, and an intermediate surface that is disposed between the upper and lower surfaces. A silicide layer is formed on a top surface of the source/drain region, a side surface of the source/drain region, and the intermediate surface of the dielectric fin structure.

In one or more embodiments, a device includes a substrate and a first transistor on the substrate. The first transistor includes a plurality of first semiconductor nanostructures corresponding to a channel region of the first transistor. A second transistor is disposed on the substrate, and the second transistor includes a plurality of second semiconductor nanostructures corresponding to a channel region of the second transistor. A source/drain region is in contact with the plurality of first semiconductor nanostructures and the plurality of second semiconductor nanostructures along a first direction. A first dielectric fin structure and a second dielectric fin structure are disposed adjacent to opposite sides of the source/drain region along a second direction that is transverse to the first direction. Each of the first and second dielectric fin structures includes a respective upper surface, a lower surface, and an intermediate surface that is disposed between the upper and lower surfaces. A silicide layer is on a top surface and side surfaces of the source/drain region, and the silicide layer is disposed on the intermediate surfaces of each of the first and second dielectric fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a first channel region of a first transistor overlying the substrate;
   a source/drain region in contact with the first channel region, the source/drain region adjacent to the first channel region along a first direction, the source/drain region having a first surface opposite the substrate and side surfaces extending from the first surface;
   a dielectric fin structure adjacent to the source/drain region along a second direction that is transverse to the first direction, the dielectric fin structure having an upper surface, a lower surface, and an intermediate surface that is disposed between the upper and lower surfaces; and
   a silicide layer on the first surface and the side surfaces of the source/drain region and on the intermediate surface of the dielectric fin structure.

2. The device of claim 1, wherein the first channel region includes a plurality of first semiconductor nanostructures.

3. The semiconductor device of claim 1, further comprising a source/drain contact on the silicide layer, the silicide layer disposed between the source/drain contact and the first surface and side surfaces of the source/drain region.

4. The semiconductor device of claim 1, wherein the source/drain contact is disposed on and in contact with the intermediate surface of the dielectric fin structure.

5. The semiconductor device of claim 1, further comprising a shallow trench isolation region extending into the substrate, and the dielectric fin structure is disposed on the shallow trench isolation region,
   wherein the dielectric fin structure includes a recessed side surface that extends between the intermediate surface and the upper surface of the dielectric fin structure.

6. The semiconductor device of claim 5, wherein a lateral distance between the recessed side surface of the dielectric fin structure and an outer side surface of the shallow trench isolation region is within a range from 10 nm to 100 nm.

7. The semiconductor device of claim 5, wherein a lateral distance between an outer side surface of the dielectric fin structure and the recessed side surface of the dielectric fin structure is less than 10 nm.

8. The semiconductor device of claim 1, further comprising a second transistor including a second channel region, wherein the source/drain region is adjacent to and in contact with the second channel region along the first direction.

9. The semiconductor device of claim 8, wherein the first transistor includes a first gate electrode overlying the first channel region, the second transistor includes a second gate electrode overlying the second channel region, and the silicide layer is positioned between the first and second gate electrodes.

10. The semiconductor device of claim 9, wherein the first channel region includes a plurality of first semiconductor nanostructures spaced apart from one another and overlying the substrate, the second channel region includes a plurality of second semiconductor nanostructures spaced apart from one another and overlying the substrate, the first gate electrode surrounds the first semiconductor nano structures, and the second gate electrode surrounds the second semiconductor nanostructures.

11. The semiconductor device of claim 10, wherein the source/drain region contacts the plurality of first nano structures and the plurality of second nanostructures.

12. A method, comprising:
   forming a first channel region of a first transistor;
   forming a source/drain region in contact with the first channel region, the source/drain region adjacent to the first channel region along a first direction;
   forming a dielectric fin structure adjacent to the source/drain region along a second direction that is transverse to the first direction, the dielectric fin structure having an upper surface, a lower surface, and an intermediate surface that is disposed between the upper and lower surfaces; and
   forming a silicide layer on a top surface of the source/drain region, a side surface of the source/drain region, and the intermediate surface of the dielectric fin structure.

13. The method of claim 12, wherein the forming the dielectric fin structure includes:
   forming the intermediate surface of the dielectric fin structure by removing a portion of a dielectric layer of the dielectric fin structure.

14. The method of claim 12, further comprising:
   forming a source/drain contact on the silicide layer and on the intermediate surface of the dielectric fin structure.

15. The method of claim 14, wherein the source/drain contact covers upper and side surfaces of the silicide layer.

16. The method of claim 12, wherein forming the first channel region of the first transistor includes forming a stack of first semiconductor nanostructures spaced apart from one another and overlying the substrate.

17. The method of claim 12, further comprising:
   forming a second channel region of a second transistor,
   wherein the forming the source/drain region includes forming the source/drain region in contact with the second channel region, the source/drain region adjacent to the second channel region along the first direction.

18. A device, comprising:
   a substrate;
   a first transistor on the substrate, the first transistor including a plurality of first semiconductor nanostructures corresponding to a channel region of the first transistor;
   a second transistor on the substrate, the second transistor including a plurality of second semiconductor nanostructures corresponding to a channel region of the second transistor;
   a source/drain region in contact with the plurality of first semiconductor nanostructures and the plurality of second semiconductor nanostructures along a first direction;
   a first dielectric fin structure and a second dielectric fin structure adjacent to opposite sides of the source/drain region along a second direction that is transverse to the first direction, each of the first and second dielectric fin structures including a respective upper surface, a lower surface, and an intermediate surface that is disposed between the upper and lower surfaces; and
   a silicide layer on a top surface and side surfaces of the source/drain region, the silicide layer disposed on the intermediate surfaces of each of the first and second dielectric fin structures.

19. The device of claim 18, further comprising a source/drain contact on the silicide layer and on the intermediate surfaces of each of the first and second dielectric fin structures.

20. The device of claim 18, wherein the first transistor includes a first gate electrode overlying the first channel region, the second transistor includes a second gate electrode overlying the second channel region, and the silicide layer is positioned between the first and second gate electrodes.

* * * * *